(12) United States Patent
Matsuo

(10) Patent No.: US 9,299,912 B2
(45) Date of Patent: Mar. 29, 2016

(54) VIBRATOR ELEMENT, MANUFACTURING METHOD OF VIBRATOR ELEMENT, SENSOR UNIT, AND ELECTRONIC APPARATUS

(71) Applicant: Seiko Epson Corporation, Tokyo (JP)

(72) Inventor: Atsushi Matsuo, Okaya (JP)

(73) Assignee: Seiko Epson Corporation (JP)

(*) Notice: Subject to any disclaimer, the term of this patent is extended or adjusted under 35 U.S.C. 154(b) by 324 days.

(21) Appl. No.: 13/856,620

(22) Filed: Apr. 4, 2013

(65) Prior Publication Data

US 2013/0264908 A1    Oct. 10, 2013

(30) Foreign Application Priority Data

Apr. 6, 2012 (JP) ................. 2012-087124

(51) Int. Cl.
*G01C 19/56* (2012.01)
*H01L 41/107* (2006.01)
*H01L 41/047* (2006.01)
*H01L 41/25* (2013.01)
*G01C 19/5607* (2012.01)

(52) U.S. Cl.
CPC .......... *H01L 41/107* (2013.01); *G01C 19/5607* (2013.01); *H01L 41/047* (2013.01); *H01L 41/25* (2013.01); *Y10T 29/42* (2015.01)

(58) Field of Classification Search
CPC ............................ G01C 19/56; G01C 19/5607
USPC ............................ 310/370; 73/504.12, 504.16
See application file for complete search history.

(56) References Cited

U.S. PATENT DOCUMENTS

| 5,396,144 | A | 3/1995 | Gupta et al. |
| 6,177,756 | B1* | 1/2001 | Yachi et al. .................. 310/370 |
| 8,925,383 | B2* | 1/2015 | Murakami et al. ......... 73/504.12 |
| 2012/0126664 | A1* | 5/2012 | Ogura et al. .................. 310/312 |
| 2013/0205898 | A1* | 8/2013 | Nakagawa ................. 73/504.16 |
| 2013/0305824 | A1* | 11/2013 | Nishizawa et al. ........ 73/504.12 |
| 2013/0312519 | A1* | 11/2013 | Ichikawa .................. 73/504.12 |

FOREIGN PATENT DOCUMENTS

| JP | 07-055479 | 3/1995 |
| JP | 10-078326 | 3/1998 |
| JP | 2008-014887 | 1/2008 |
| JP | 2008-209215 | 9/2008 |
| JP | 2012-112748 | 6/2012 |

* cited by examiner

*Primary Examiner* — J. San Martin
(74) *Attorney, Agent, or Firm* — Harness, Dickey & Pierce, P.L.C.

(57) ABSTRACT

A vibration gyro-element includes a base portion, an excitation vibrating arm and a detection vibrating arm extending from the base portion, and a first adjustment vibrating arm and a second adjustment vibrating arm extending from the base portion and vibrating along with excitation vibration of the excitation vibrating arm, wherein an output signal of the first adjustment vibrating arm at least is out of phase with respect to an output signal of leakage vibration of the detection vibrating arm, and wherein an amplitude of the output signal of the first adjustment vibrating arm is larger than an amplitude of the output signal of the second adjustment vibrating arm.

6 Claims, 11 Drawing Sheets

VIBRATOR ELEMENT, MANUFACTURING METHOD OF VIBRATOR ELEMENT, SENSOR UNIT, AND ELECTRONIC APPARATUS

BACKGROUND

1. Technical Field

The present invention relates to a vibrator element, a manufacturing method of the vibrator element, and a sensor unit and an electronic apparatus using the vibrator element.

2. Related Art

There is an angular velocity sensor (a vibration gyro sensor) or the like which is used for, for example, vehicle body control of a vehicle, own-vehicle position detection of a car navigation system, vibration control correction (so-called camera shake correction) of a digital camera or a video camera, and the like, and detects a physical quantity such as angular velocity, acceleration, or the like, as a sensor element (for example, JP-A-2008-14887).

An angular velocity sensor disclosed in JP-A-2008-14887 has a tuning fork which includes two arms and a base portion which connects first ends of the two arms to each other. In addition, in the angular velocity sensor disclosed in JP-A-2008-14887, the tuning fork is made of a non-piezoelectric body material, and an excitation portion and a detection portion in which a piezoelectric thin film is interposed between a pair of electrodes are provided for each arm.

In this angular velocity sensor, a voltage is applied between a pair of electrodes of an excitation portion, and thereby the arm performs flexural vibration (excitation). In addition, when the angular velocity around an axial line in an extension direction is applied to the arm in this excitation state, the arm of the detection portion is bent by the Coriolis force in a direction perpendicular to the above-described excitation direction, and charge generated according to a bending amount thereof is detected from the electrodes of the detection portion. The angular velocity can be detected based on the detected charge.

The above-described tuning fork having two arms is generally formed by etching a substrate. At this time, it is difficult to form the size of the tuning fork as designed due to etching anisotropy of the substrate, a variation in processing process, or the like. For this reason, the tuning fork is formed in an unintended shape, and thus there are cases where the arm of the detection portion is bent in a direction different from the flexural vibration direction even in a state in which the angular velocity is not applied thereto. If charge generated from a pair of electrodes of the detection portion due to bending of the arm is detected, detection accuracy is lowered.

Therefore, in the angular velocity sensor disclosed in JP-A-2008-14887, a pair of electrodes of the detection portion is partially removed, and thereby an amount of charge output from the detection portion in a state in which the angular velocity is not applied to the arm is adjusted.

However, in the method in which an amount of charge is adjusted by partially removing a pair of electrodes of the detection portion, in a case where an adjustment amount is large, a variation of a charge amount relative to a removal amount is required to be increased, and thus an accurate adjustment of a charge amount becomes difficult. In addition, if a variation of a charge amount relative to a removal amount is made to be small, an adjustment range is narrowed, and thus there is a problem in that the adjustment cannot be performed.

SUMMARY

An advantage of some aspects of the invention is to solve at least a part of the problems described above, and the invention can be implemented as the following forms or application examples.

Application Example 1

This application example 1 is directed to a vibrator element including: a base portion; an excitation vibrating arm and a detection vibrating arm extending from the base portion; and a first adjustment vibrating arm and a second adjustment vibrating arm extending from the base portion and vibrating along with excitation vibration of the excitation vibrating arm, wherein an output signal of the first adjustment vibrating arm at least is out of phase with an output signal of leakage vibration of the detection vibrating arm, and wherein an amplitude of the output signal of the first adjustment vibrating arm is larger than an amplitude of the output signal of the second adjustment vibrating arm.

According to this application example, an output signal of the first adjustment vibrating arm and the second adjustment vibrating arm is made to be out of phase with an output signal generated in the detection vibrating arm due to leakage vibration of the excitation vibrating arm, and thereby it is possible to cancel out and suppress a leakage output of the excitation vibrating arm.

In addition, the amplitude of the output signal of the first adjustment vibrating arm is made to be larger than the amplitude of the output signal of the second adjustment vibrating arm, and thereby it is possible to perform a so-called coarse adjustment in the first adjustment vibrating arm and to perform a so-called fine adjustment in the second adjustment vibrating arm. As a result, it is possible to suppress a leakage signal of the excitation vibrating arm widely and with high accuracy.

Application Example 2

In the vibrator element according to the application example, it is preferable that, when a vibration frequency of the first adjustment vibrating arm is indicated by $f_{tu1}$, a vibration frequency of the second adjustment vibrating arm is indicated by $f_{tu2}$, a vibration frequency of the excitation vibrating arm is indicated by fk, and $\Delta f1=|fk-f_{tu1}|$ and $\Delta f2=|fk-f_{tu2}|$, $\Delta f1<\Delta f2$ is satisfied.

In this way, if $\Delta f1<\Delta f2$, $f_{tu1}$ is closer to fk than $f_{tu2}$. Therefore, the first adjustment vibrating arm can be used for coarse adjustment, and the second adjustment vibrating arm can be used for fine adjustment.

Application Example 3

In the vibrator element according to the application example, it is preferable that the detection vibrating arm is provided with a detection electrode which electrically detects vibration generated according to a physical quantity applied when the excitation vibrating arm is excited, and each of the first adjustment vibrating arm and the second adjustment vibrating arm is provided with an adjustment electrode which is electrically connected to the detection electrode.

With this configuration, when a physical quantity such as an angular velocity or acceleration is applied to the vibrator element, the physical quantity can be detected using the detection electrode, and thus it is possible to implement a physical quantity sensor which is miniaturized and has high sensitivity characteristics.

Application Example 4

In the vibrator element according to the application example, it is preferable that the excitation vibrating arm extends from one end of the base portion, the detection vibrating arm extends from the other end of the base portion on an opposite side to one end, the first adjustment vibrating arm extends in the extending direction of the excitation vibrating arm, and the second adjustment vibrating arm extends in the extending direction of the detection vibrating arm.

In the vibrator element with this configuration, since the vibrating arm of an excitation system and the vibrating arm of a detection system, and the vibrating arm of an adjustment system are separated from each other, electrostatic coupling is reduced between electrodes or wires of the vibrating arm of the excitation system and the vibrating arm of the detection system, and the vibrating arm of the adjustment system, and thus it is possible to suppress deterioration of detection sensitivity due to provision of the vibrating arm of the adjustment system.

Application Example 5

In the vibrator element according to the application example, it is preferable that a length of the first adjustment vibrating arm is greater than a length of the second adjustment vibrating arm.

A cross-sectional shape or length of each adjustment vibrating arm may be changed such that the first adjustment vibrating arm and the second adjustment vibrating arm satisfy the condition $\Delta f1 < \Delta f2$. In a case of changing the lengths of the first adjustment vibrating arm and the second adjustment vibrating arm, when an exterior of the vibrator element is formed in an etching method or the like, the exterior can be formed easily and with high accuracy.

Application Example 6

This application example is directed to a sensor unit including: the vibrator element according to any one of the above-described application examples; an electronic component including an excitation circuit which excites the excitation vibrating arm and a detection circuit which detects a detection signal occurring in the detection vibrating arm; and a package accommodating the vibrator element and the electronic component.

According to this application example, it is possible to provide a sensor unit having the vibrator element capable of achieving the effect according to any one of the above-described application examples.

In addition, the sensor unit of the package type with the above-described configuration is advantageous to miniaturization and thinning, and has characteristics in which impact resistance is high.

Application Example 7

This application example is directed to an electronic apparatus including the vibrator element according to any one of the above-described application examples.

According to this application example, since the electronic apparatus includes the high sensitivity vibrator element on which an adjustment for suppressing a leakage output has been performed, it is possible to provide an electronic apparatus which has a high performance and a stable characteristic.

Application Example 8

This application example is directed to a manufacturing method of a vibrator element including a base portion, an excitation vibrating arm and a detection vibrating arm extending from the base portion, and a first adjustment vibrating arm and a second adjustment vibrating arm extending from the base portion and vibrating along with excitation vibration of the excitation vibrating arm, the method including: forming an exterior of the vibrator element; detecting a current value of an apparent leakage signal obtained by combining a leakage signal of the detection vibrating arm and a tuning signal of the first adjustment vibrating arm and the second adjustment vibrating arm; performing a coarse adjustment until a current value of the apparent leakage signal becomes equal to or less than a variable current value of the second adjustment vibrating arm by removing or adding a part of an adjustment portion of the first adjustment vibrating arm and; and performing fine adjustment so that a current value of the apparent leakage signal becomes equal to or less than a standard value by removing or adding a part of an adjustment portion of the second adjustment vibrating arm.

According to the manufacturing method of this application example, a current value of an apparent leakage signal obtained by combining a leakage signal of the detection vibrating arm and a tuning signal of the first adjustment vibrating arm and the second adjustment vibrating arm is detected, a coarse adjustment is performed until a current value of the apparent leakage signal becomes equal to or less than a variable current value of the second adjustment vibrating arm by removing or adding a part of an adjustment portion of the first adjustment vibrating arm and, fine adjustment is performed so that a current value of the apparent leakage signal becomes equal to or less than a standard value by removing or adding a part of an adjustment portion of the second adjustment vibrating arm.

This method is advantageous to miniaturization and enables an accurate adjustment to be performed as compared with a method in the related art of suppressing and adjusting a leakage output by processing a part of the exterior of the vibrator element, and thus it is possible to manufacture a vibrator element which is miniaturized and has high sensitivity.

In addition, an adjustable range is made to be wide in the coarse adjustment, and the accurate adjustment is made to be able to be performed in the fine adjustment. Therefore, it is possible to efficiently suppress leakage vibration.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings.

In addition, the drawings referred to in the following description are schematic diagrams in which vertical and horizontal scales of each member or each portion are different from practical ones, in order to show each member in a recognizable size.

Vibrator Element

First, a configuration of the vibrator element will be described with reference to the drawings. In the present embodiment, a vibration gyro-element will be described as a specific example of the vibrator element.

Figure 1:
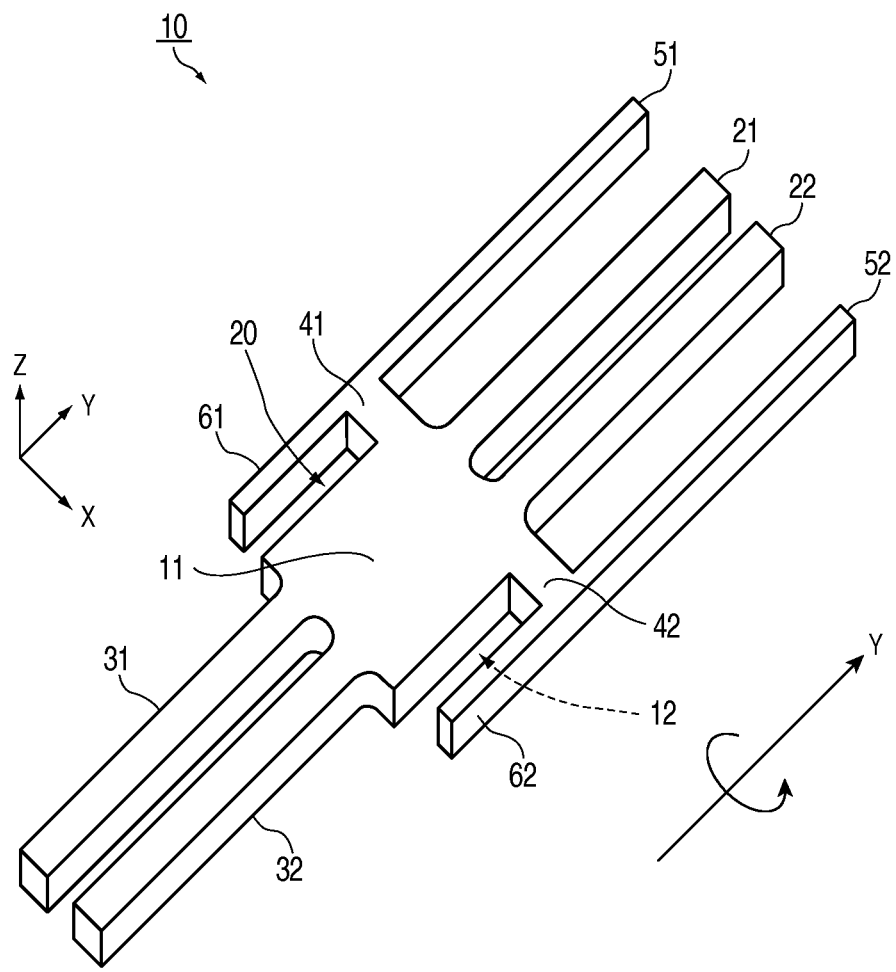
FIG. 1 is a perspective view illustrating a schematic configuration of a vibration gyro-element as a vibrator element.

FIG. 1 is a perspective view illustrating a schematic configuration of a vibration gyro-element as the vibrator element. As shown in FIG. 1, the vibration gyro-element 10 includes a base portion 20 which is formed by processing a base material (a material forming a main portion) using wet etching dry etching, or the like, excitation vibrating arms 21 and 22, detection vibrating arms 31 and 32, and first adjustment vibrating arms 51 and 52 and second adjustment vibrating arms 61 and 62 which are two pairs of adjustment vibrating arms, extending from the base portion 20.

In the present embodiment, a description will be made of an example of using a quartz crystal which is a piezoelectric body material as a base material of the vibration gyro-element 10. The quartz crystal has an X axis called an electric axis, a Y axis called a mechanical axis, and a Z axis called an optical axis. In the present embodiment, a description will be made of an example of using, as a base material, a so-called quartz crystal Z-cut plate which is cut along a plane defined by the X axis and the Y axis perpendicular to each other in the crystal axes of the quartz crystal, is processed in a plate shape, and has a predetermined thickness in the Z axis direction perpendicular to the plane. In addition, the predetermined thickness described here is appropriately set depending on an oscillation frequency (resonance frequency), an exterior size, processability, and the like.

In addition, errors of a cut angle from the quartz crystal may be allowable in some ranges for each of the X axis, the Y axis, and the Z axis in the plate forming the vibration gyro-element 10. For example, a plate which is rotated and is cut in a range of 0 degrees to 2 degrees with respect to the X axis may be used. This is also the same for the Y axis and the Z axis.

Of a pair of vibrating arms, first excitation vibrating arms 21 and 22 extend in parallel to each other along the Y axis from one end part (in the figure, the end part in the +Y direction) of end parts in the Y direction of the base portion 20 with an approximately rectangular shape which is located at the center. In addition, of a pair of vibrating arms, second detection vibrating arms 31 and 32 extend in parallel to each other along the Y axis from the other end part (in the figure, the end part in the −Y direction) of the base portion 20.

As above, the vibration gyro-element 10 is referred to as an H type vibrator element (an H type vibration gyro-element) in some cases from the shape in which the excitation vibrating arms 21 and 22 and the detection vibrating arms 31 and 32 respectively extend in the coaxial direction from each of both the end parts of the base portion 20.

Since, in the H type vibration gyro-element 10, the excitation vibrating arms 21 and 22 and the detection vibrating arms 31 and 32 respectively extend in the coaxial direction from each of both the end parts of the base portion 20, vibrating arms of the excitation system and vibrating arms of the detection system are separated. Therefore, there is a feature in which electrostatic coupling between electrodes or wires of the excitation system and the detection system is reduced, and thus detection sensitivity is stable. In addition, in the present embodiment, the excitation vibrating arms and detection vibrating arms are provided in twos, respectively, as vibrating arms; however, the number of each of the vibrating arms may be one or three or more. In addition, an excitation electrode and a detection electrode may be formed in a single vibrating arm.

In addition, the vibration gyro-element 10 includes one pair of first adjustment vibrating arms 51 and 52 and the other pair of second adjustment vibrating arms 61 and 62 as two pairs of adjustment vibrating arms which extend in a direction intersecting the crystal X axis (electric axis) of the quartz crystal. The first adjustment vibrating arm 51 extends in parallel to the excitation vibrating arm 21 in the +Y direction from an end part of a first connection portion 41 which protrudes in the −X direction from the base portion 20. The first adjustment vibrating arm 52 extends in parallel to the excitation vibrating arm 22 in the +Y direction from an end part of a second connection portion 42 which protrudes in the +X direction from the base portion 20.

In addition, the second adjustment vibrating arm 61 is an extension of the first adjustment vibrating arm 51 and extends in the −Y direction (the detection vibrating arm 31 side direction). The second adjustment vibrating arm 62 is an extension of the first adjustment vibrating arm 52 and extends in the −Y direction (the detection vibrating arm 32 side). In the present embodiment, the length of each of the second adjustment vibrating arms 61 and 62 is smaller than the length of each of the first adjustment vibrating arms 51 and 52, and a cross-sectional shape of a cut section in the X direction thereof is the same as that of each of the first adjustment vibrating arms 51 and 52.

Specifically, as described later in detail with reference to FIGS. 2 and 3, in the vibration gyro-element 10 as a vibrator element, excitation electrodes are formed in the excitation vibrating arms 21 and 22, and detection electrodes are formed in the detection vibrating arms 31 and 32. An excitation signal is applied to the excitation electrodes, and thereby the excitation vibrating arms 21 and 22 can be made to perform flexural vibration in the X direction. When the excitation signal is applied to the vibration gyro-element 10 and thereby the excitation vibrating arms 21 and 22 perform flexural vibration, the vibration gyro-element 10 is rotated with respect to the Y axis which is used as a detection axis, and thus the detection vibrating arms 31 and 32 vibrate in the Z direction perpendicular to the X-Y plane by the Coriolis force. The amplitude of the detection vibrating arms 31 and 32 is proportional to the rotation speed of the vibration gyro-element 10 and can be thus detected as an angular velocity.

Next, an electrode configuration of the vibration gyro-element 10 of the present embodiment will be described.

Figure 2:
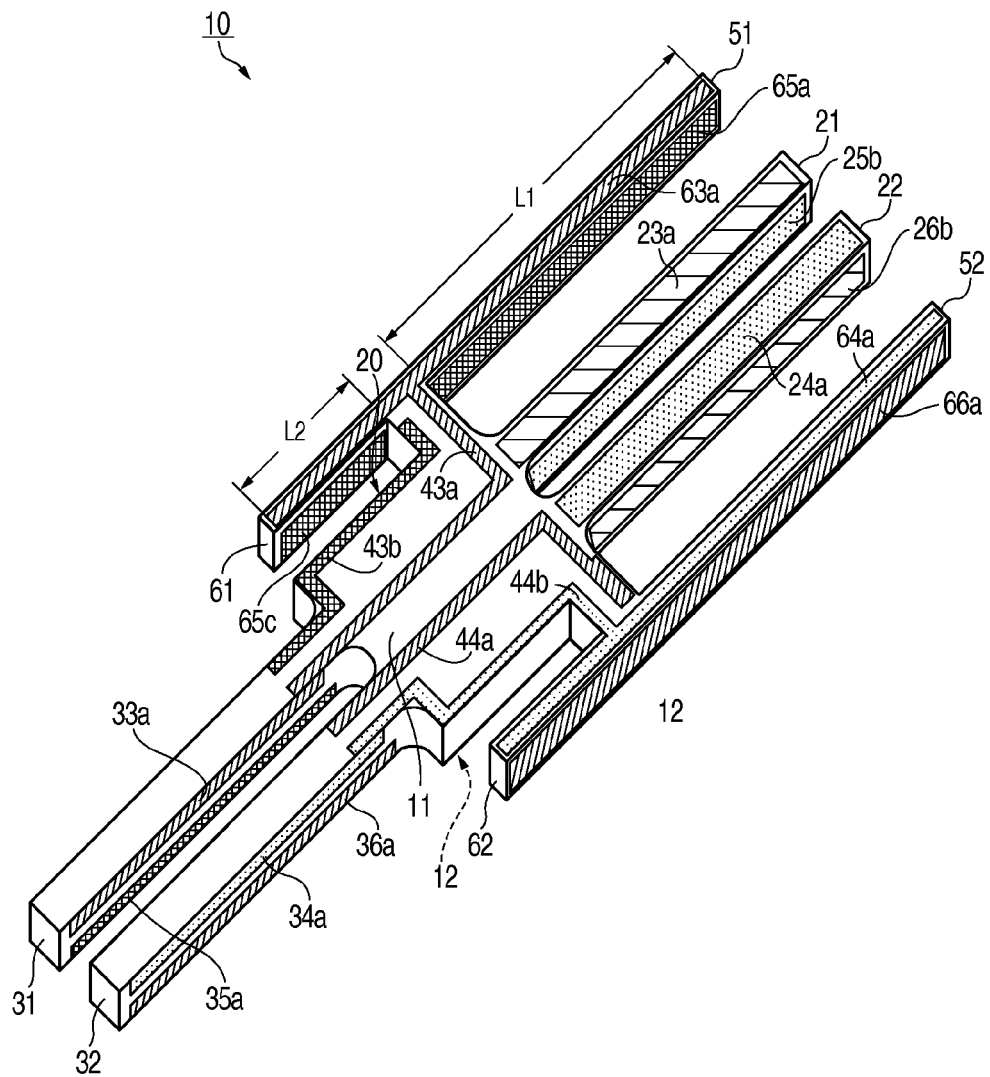
FIG. 2 is an explanatory diagram illustrating disposition of electrodes when the vibration gyro-element is viewed from a first main surface side.
Figure 3:
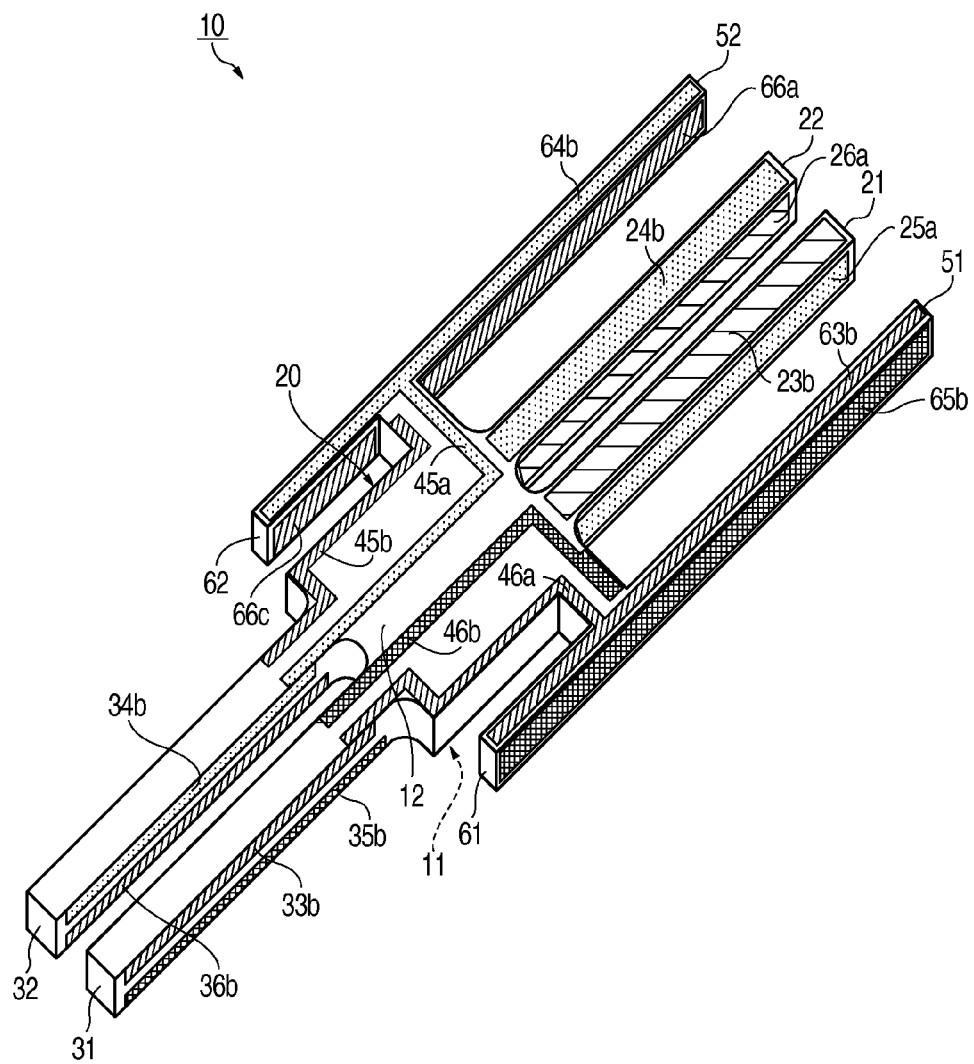
FIG. 3 is an explanatory diagram illustrating disposition of electrodes when the vibration gyro-element is viewed from a second main surface side.

FIG. 2 is an explanatory diagram illustrating disposition of electrodes when the vibration gyro-element 10 is viewed from a first main surface 11 side, and FIG. 3 is an explanatory diagram illustrating disposition of electrodes when the vibration gyro-element 10 is viewed from a second main surface 12 side. In addition, in FIGS. 2 and 3, a connection relationship of the electrodes among the detection vibrating arms 31 and 32, the first adjustment vibrating arms 51 and 52, and the second adjustment vibrating arms 61 and 62, which are characteristic in the electrode disposition of the present embodiment, is mainly described, and a connection relationship of electrodes (excitation electrodes) of the excitation system provided in the excitation vibrating arms 21 and 22 is the same as a connection relationship of electrodes of the excitation system of a vibration gyro-element in the related art and is thus briefly shown and described.

First, electrodes provided in the excitation vibrating arms 21 and 22 will be described.

As shown in FIG. 2, excitation electrodes 23a and 24a are provided in the first main surface 11 of the excitation vibrating arms 21 and 22. In addition, excitation electrodes 25b and 26b are respectively provided in the first side surfaces of both side surfaces of the excitation vibrating arms 21 and 22.

Further, as shown in FIG. 3, excitation electrodes 24b and 23b are provided in the second main surface 12 opposite to the first main surface 11 of the excitation vibrating arms 21 and 22. Excitation electrodes 26a and 25a are respectively provided in second side surfaces opposite to the first side surfaces of the excitation vibrating arms 21 and 22.

In the excitation electrodes 23a, 24b, 24a and 23b, and the excitation electrodes 25a, 25b, 26a and 26b provided in both the main surfaces and both the side surfaces of the excitation vibrating arms 21 and 22, the corresponding electrodes are connected to each other via connection wires (not shown) such that the first main surface 11, the second main surface 12, and both side surfaces (inside surface and outside surface) between both the main surfaces respectively have the same potentials. In the present embodiment, in one excitation vibrating arm 21, the excitation electrode 23a and the excitation electrode 23b provided in both the main surfaces have the same potential, and the excitation electrode 25a and the excitation electrode 25b provided in both the side surfaces have the same potential. In addition, in the excitation vibrating arm 22, the excitation electrode 24a and the excitation electrode 24b provided in both the main surfaces have the same potential, and the excitation electrode 26a and the excitation electrode 26b provided in both the side surfaces have the same potential. Here, one of the excitation electrodes opposite to each other with the same potential in the excitation vibrating arms 21 and 22, for example, the excitation electrodes 23a and 23b provided in both the main surfaces of the excitation vibrating arm 21 and the excitation electrodes 26a and 26b provided in both the side surfaces of the excitation vibrating arm 22 are ground electrodes.

Next, electrodes provided in the detection vibrating arms 31 and 32 will be described.

As shown in FIG. 2, detection electrodes 33a and 35a which are detection electrodes for detecting distortion of the base material (quartz crystal) generated due to vibration are provided in one of both side surfaces of the detection vibrating arm 31, and detection electrodes 34a and 36a are provided in one of both side surfaces of the detection vibrating arm 32. Specifically, a pair of detection electrodes 33a and 35a with different potentials from each other are provided in the extending direction of the detection vibrating arm 31 of a pair of detection vibrating arms, and a pair of detection electrodes 34a and 36a with different potentials from each other are provided around both end parts in the extending direction of the detection vibrating arm 32 in one side surface of the detection vibrating arm 32.

In addition, as shown in FIG. 3, detection electrodes 34b and 36b and detection electrodes 33b and 35b are provided in the other side surfaces opposite to the above-described side surfaces of the detection vibrating arms 31 and 32. Specifically, a pair of detection electrodes 33b and 35b with different potentials from each other are provided in the extending direction of the detection vibrating arm 31 in the other side surface of the detection vibrating arms 31 of a pair of detection vibrating arms 31 and 32, and a pair of detection electrodes 34b and 36b with different potentials from each other are provided around both end parts in the extending direction of the detection vibrating arm 32 in the other side surface of the detection vibrating arm 32.

In addition, the detection electrodes opposite to each other in both the side surfaces of the detection vibrating arms 31 and 32 have the same potential. In other words, in both the side surfaces of the detection vibrating arm 31, the detection electrode 33a and the detection electrode 33b opposite to each other have the same potential, and the detection electrode 35a and the detection electrode 35b opposite to each other have the same potential. In addition, in both the side surfaces of the detection vibrating arm 32, the detection electrode 34a and the detection electrode 34b opposite to each other have the same potential, and the detection electrode 36a and the detection electrode 36b opposite to each other have the same potential. Here, one of the detection electrodes opposite to each other with the same potential in the detection vibrating arms 31 and 32, for example, the detection electrodes 35a and 35b provided so as to be opposite to each other in both the side surfaces of the detection vibrating arm 31, and the detection electrodes 36a and 36b provided so as to be opposite to each other in both the side surfaces of the detection vibrating arm 32 are ground electrodes.

Next, a description will be made of adjustment electrodes which are an adjustment portion provided in the first adjustment vibrating arms 51 and 52 and the second adjustment vibrating arms 61 and 62.

As shown in FIG. 2, adjustment electrodes 63a and 64a are provided in the first main surface 11 of one pair of the first adjustment vibrating arms 51 and 52 of two pairs of adjustment vibrating arms. In addition, adjustment electrodes 65a and 66a are provided in first side surfaces of both side surfaces of the first adjustment vibrating arms 51 and 52.

In addition, as shown in FIG. 3, adjustment electrodes 64b and 63b are provided in the second main surface 12 of the first adjustment vibrating arms 51 and 52. In addition, adjustment electrodes 65b and 66a are provided in the second side surfaces opposite to the first side surfaces of the first adjustment vibrating arms 51 and 52.

In the present embodiment, the detection electrodes of the detection vibrating arms 31 and 32 are electrically connected to the corresponding adjustment electrodes of the first adjustment vibrating arms 51 and 52.

Specifically, as shown in FIGS. 2 and 3, the detection electrode 33a of the detection vibrating arm 31 is connected to the adjustment electrode 63a of the first adjustment vibrating arm 51 via an inter-electrode wire 43a; the detection electrode 35a is connected to the adjustment electrode 65a via an inter-electrode wire 43b and another inter-electrode wire (not shown); the detection electrode 33b is connected to the adjustment electrode 63b via an inter-electrode wire 46a; and the detection electrode 35b is connected to the adjustment electrode 65b via an inter-electrode wire 46b.

In addition, the detection electrode 34a of the detection vibrating arm 32 is connected to the adjustment electrode 64a of the first adjustment vibrating arm 52 via an inter-electrode wire 44b; the detection electrode 36a is connected to the adjustment electrode 66a via an inter-electrode wire 44a; the detection electrode 34b is connected to the adjustment electrode 64b via an inter-electrode wire 45a; and the detection electrode 36b is connected to the adjustment electrode 66a via an inter-electrode wire (not shown).

Next, a description will be made of electrode disposition of the other pair of second adjustment vibrating arms 61 and 62 of two pairs of adjustment vibrating arms.

As shown in FIG. 2, adjustment electrodes 63a and 64a are provided in the first main surface 11 of the second adjustment vibrating arms 61 and 62, and adjustment electrodes 65c and 66a are provided in the first side surfaces of the second adjustment vibrating arms 61 and 62. In other words, the adjustment electrodes 63a and 64a provided in the first main surface 11 are common to the adjustment electrodes of the first adjustment vibrating arms 51 and 52, and the adjustment electrode 65a provided in the side surface of the first adjustment vibrating arm 51 is connected to the adjustment electrode 65c provided in the side surface of the second adjustment vibrating arm 61 via an inter-electrode wire (not shown). On the other hand, the adjustment electrode 66a provided in the side surface of the first adjustment vibrating arm 52 extends up to the side surface of the second adjustment vibrating arm 62.

In addition, as shown in FIG. 3, adjustment electrodes 63b and 64b are provided in the second main surface 12 of the second adjustment vibrating arms 61 and 62, and adjustment electrodes 65b and 66c are provided in the second side surfaces of the second adjustment vibrating arms 61 and 62. In other words, the adjustment electrodes 63b and 64b provided in the second main surface 12 are common to the adjustment electrodes of the first adjustment vibrating arms 51 and 52, and the adjustment electrode 65b provided in the side surface of the first adjustment vibrating arm 51 extends up to the side surface of the second adjustment vibrating arm 61. The adjustment electrode 66c provided in the side surface of the second adjustment vibrating arm 62 is connected to the adjustment electrode 66a provided in the side surface of the first adjustment vibrating arm 52 via an inter-electrode wire (not shown).

Therefore, connection relationships between the respective adjustment electrodes provided in the second adjustment vibrating arms 61 and 62 and the detection electrodes provided in the detection vibrating arms 31 and 32 are the same as those between the respective adjustment electrodes provided in the first adjustment vibrating arms 51 and 52 and the respective detection electrodes provided in the detection vibrating arms 31 and 32.

Next, a concept of suppression of leakage vibration due to the first adjustment vibrating arms 51 and 52 and the second adjustment vibrating arms 61 and 62 will be described.

Figure 4:
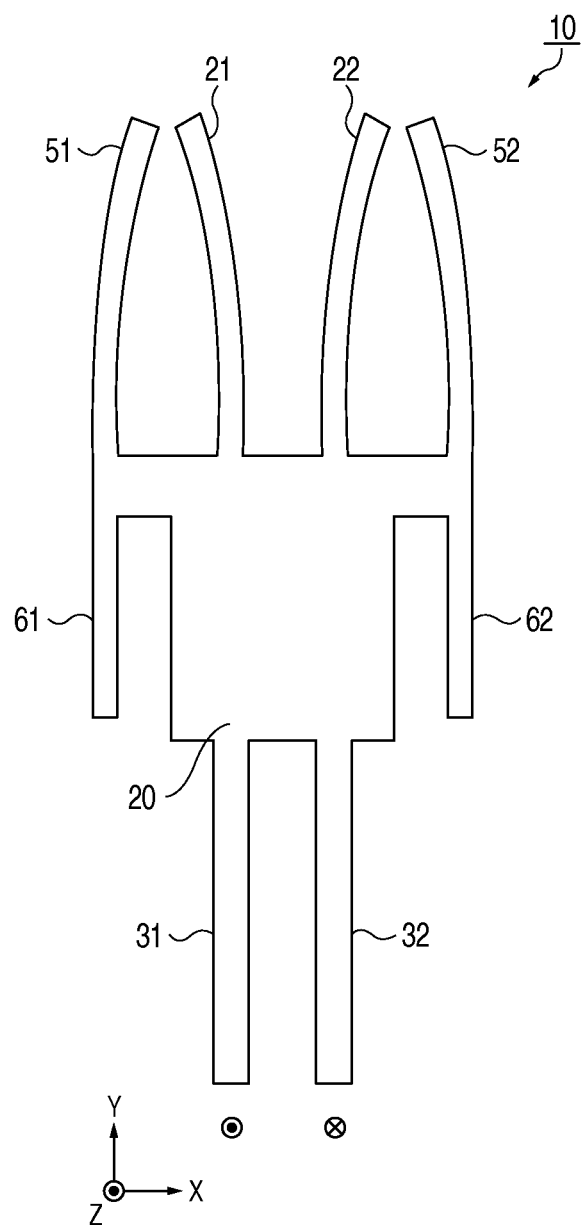
FIG. 4 is an explanatory diagram schematically illustrating a relationship between an excitation vibrating arm and a first adjustment vibrating arm.

FIG. 4 is an explanatory diagram schematically illustrating a relationship between the excitation vibrating arms 21 and 22 and the first adjustment vibrating arms 51 and 52 of the vibration gyro-element 10. When the excitation vibrating arms 21 and 22 move as shown in FIG. 4 and have an out-surface vibration component (Z direction), the out-surface vibration also occurs in the detection vibrating arms 31 and 32, and thus there are cases where a detection signal (vibration leakage) is generated even if an angular velocity is not applied. In order to cancel out this vibration leakage, vibration of the first adjustment vibrating arms 51 and 52 may be made to be out of phase with vibration of the excitation vibrating arms 21 and 22 through shift of 180 degrees. In addition, the second adjustment vibrating arms 61 and 62 vibrate in phase with the first adjustment vibrating arms 51 and 52. The electrode configuration as shown in FIGS. 2 and 3 may be used in order to perform vibration which leads to this phase relationship.

In addition, in the vibration gyro-element 10 of the present embodiment, the excitation vibrating arms 21 and 22, the first adjustment vibrating arms 51 and 52, and the second adjustment vibrating arms 61 and 62 are regulated as follows.

An excitation frequency of the excitation vibrating arms 21 and 22 is set to fk.

An in-surface tuning fork frequency (vibration frequency) of the first adjustment vibrating arms 51 and 52 is set to $f_{tu1}$.

An in-surface tuning fork frequency (vibration frequency) of the second adjustment vibrating arms 61 and 62 is set to $f_{tu2}$.

In addition, respective differences between the excitation frequency and the in-surface tuning fork frequencies are set to Δf1 and Δf2.

When $\Delta f1=|fk-f_{tu1}|$ and $\Delta f2=|fk-f_{tu2}|$, settings are performed so as to satisfy Δf1<Δf2.

In other words, of the two pairs of adjustment vibrating arms, the first adjustment vibrating arms 51 and 52 have the in-surface tuning fork frequency $f_{tu1}$ closer to the excitation frequency fk than the second adjustment vibrating arms 61 and 62. This means that an amount of charge (current) generated in the first adjustment vibrating arms 51 and 52 due to leakage vibration is larger than an amount of charge (current) generated in the second adjustment vibrating arms 61 and 62. Therefore, if the length of each adjustment electrode provided in the first adjustment vibrating arms 51 and 52 is adjusted, a coarse adjustment of the leakage vibration can be performed, and, if the length of each adjustment electrode provided in the second adjustment vibrating arms 61 and 62 in which an amount of generated charge is small is adjusted, fine adjustment of the leakage vibration can be performed.

Therefore, a method of suppressing the leakage vibration will be described.

Figure 5:
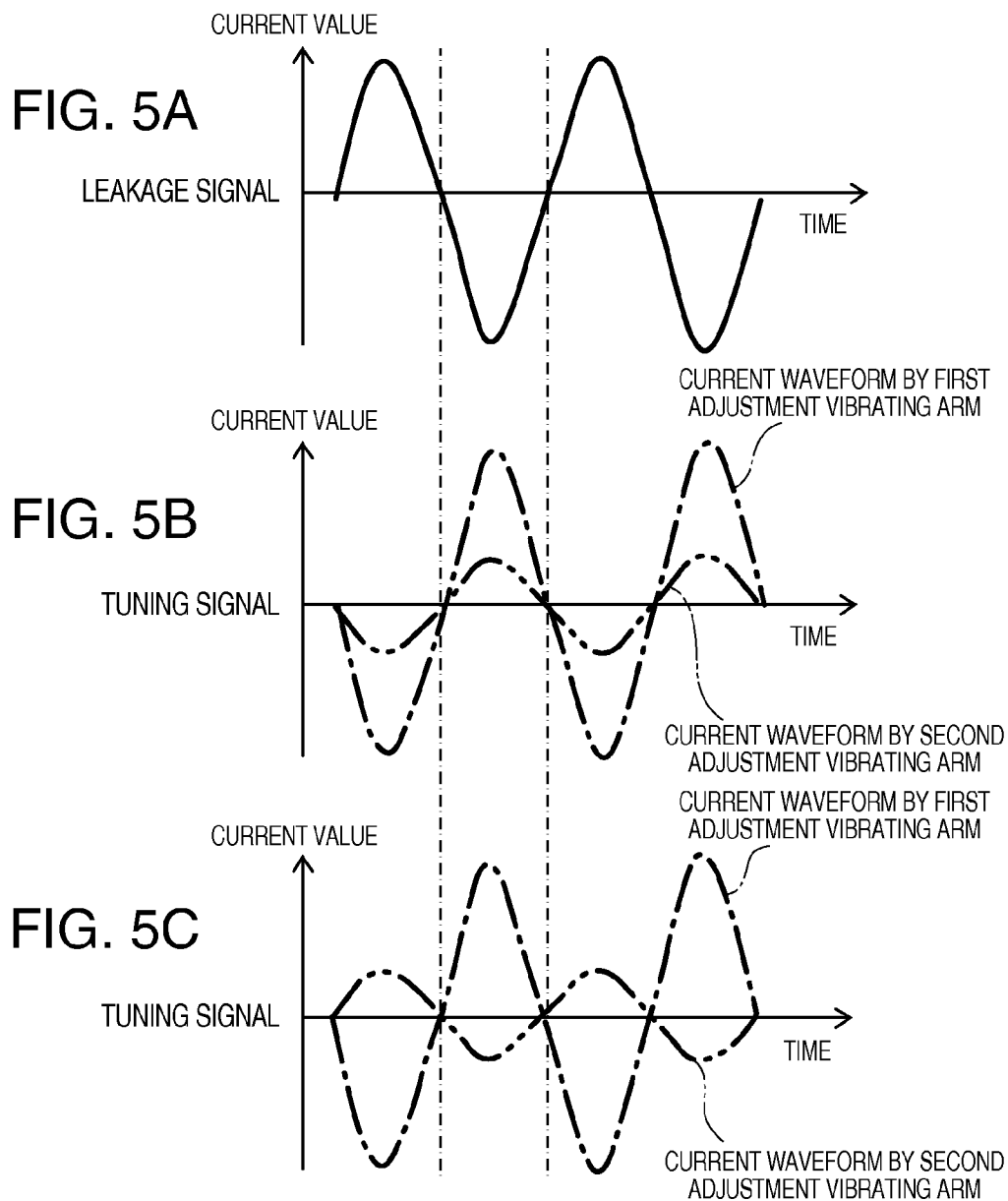
FIGS. 5A to 5C are explanatory diagrams schematically illustrating an example of the output waveform of a leakage signal and a tuning signal.

FIGS. 5A to 5C are explanatory diagrams schematically illustrating an example of the output waveforms of a leakage signal and a tuning signal. The transverse axis expresses time, and the longitudinal axis expresses a current value. FIG. 5A shows an output waveform of a leakage signal, and FIG. 5B shows a case where a current waveform (indicated by the dot chain line) of a tuning signal of the first adjustment vibrating arms 51 and 52 and a current waveform (indicated by the two-dot chain line) of the second adjustment vibrating arms 61 and 62 are phase-shifted by 180 degrees with respect to the current waveform of the leakage signal. As shown in FIGS. 5A to 5C, the amplitude of the tuning signal of the first adjustment vibrating arms 51 and 52 is greater than the amplitude of the turning signal of the second adjustment vibrating arms 61 and 62.

In addition, FIG. 5C shows a case where only the current waveform (indicated by the dot chain line) of the tuning signal of the first adjustment vibrating arms 51 and 52 is phase-shifted by 180 degrees with respect to the leakage signal. Even in this case, a coarse adjustment and a fine adjustment of the leakage vibration are possible.

In addition, the tuning signal is a current waveform after an electrode length of each adjustment electrode which is an adjustment portion of the first adjustment vibrating arms 51 and 52 and the second adjustment vibrating arms 61 and 62 is adjusted.

Next, a description will be made of a relationship between an electrode length of each adjustment electrode which is an adjustment portion of the first adjustment vibrating arms 51 and 52 and the second adjustment vibrating arms 61 and 62, and a generated current. In addition, here, a measurement result of an Example is shown.

Figure 6:
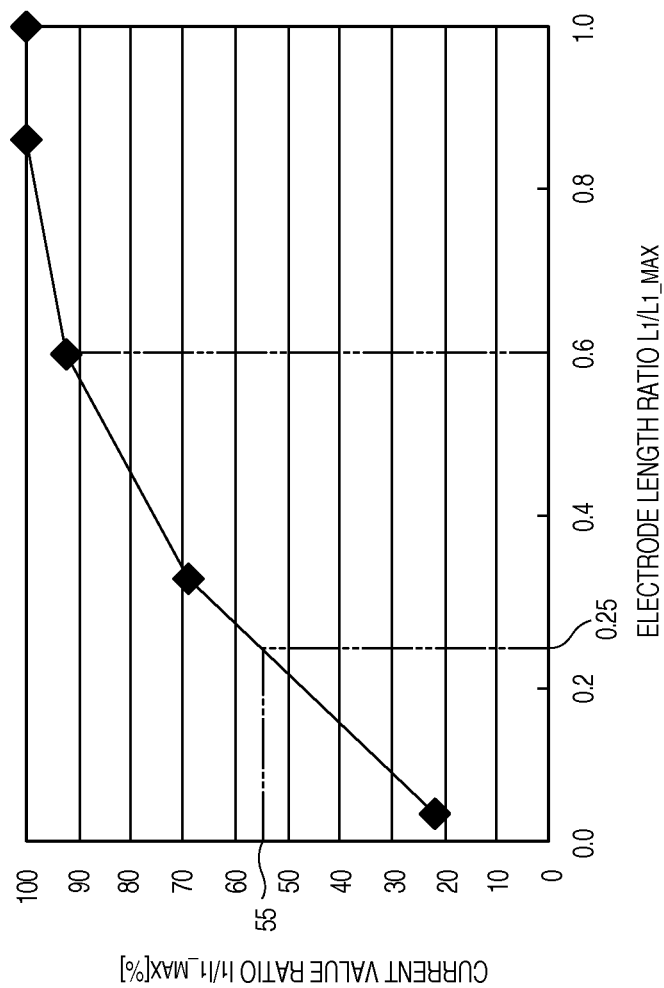
FIG. 6 is a graph illustrating a relationship between an electrode length of the first adjustment vibrating arm and a generated current.

FIG. 6 is a graph illustrating a relationship between an electrode length L1 (refer to FIG. 2) of the first adjustment vibrating arms 51 and 52 and a generated current. In addition, the longitudinal axis shown in FIG. 6 expresses a current value ratio of the first adjustment vibrating arms 51 and 52 when the maximum value of current generated in the first adjustment vibrating arms 51 and 52 is set to 100, and the transverse axis expresses an electrode length ratio of the first adjustment vibrating arms 51 and 52 when an electrode length of the first adjustment vibrating arms 51 and 52 at the time of obtaining the maximum current value is set to 1.

As shown in FIG. 6, when the electrode length ratio of the first adjustment vibrating arms 51 and 52 varies from 0.6 to 0.25, the current value ratio varies by about 35%.

Figure 7:
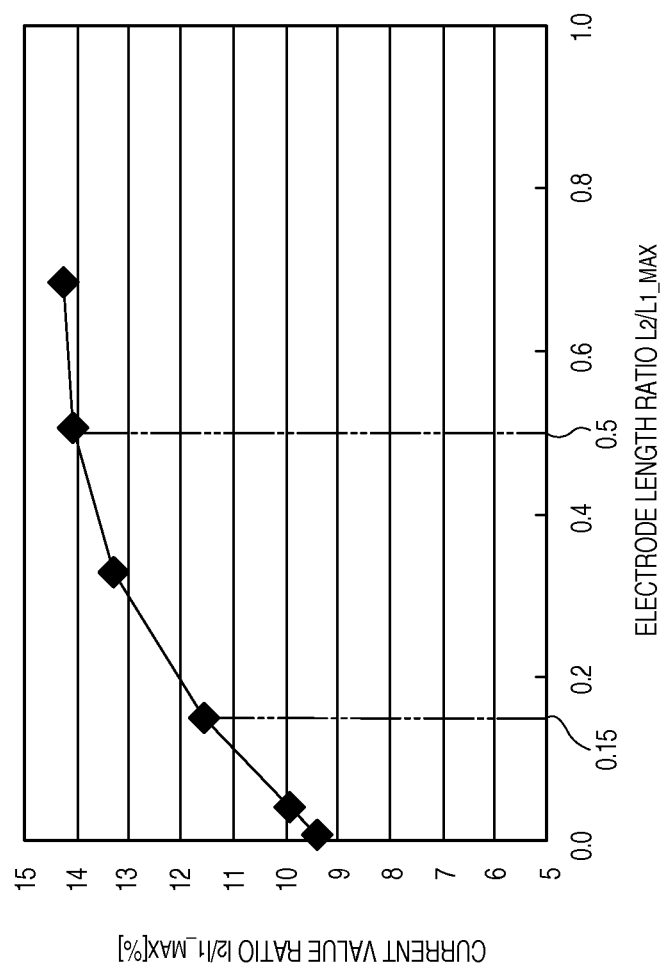
FIG. 7 is a graph illustrating a relationship between an electrode length of a second adjustment vibrating arm and a generated current.

FIG. 7 is a graph illustrating a relationship between an electrode length L2 (refer to FIG. 2) of the second adjustment vibrating arms 61 and 62 and a generated current. In addition, the longitudinal axis expresses a current value ratio of current generated in the second adjustment vibrating arms 61 and 62 when the maximum value of current generated in the first adjustment vibrating arms 51 and 52 is set to 100, and the transverse axis expresses an electrode length ratio of the second adjustment vibrating arms when an electrode length of the first adjustment vibrating arms 51 and 52 at the time of obtaining the maximum current value is set to 1.

As shown in FIG. 7, when the electrode length ratio of the second adjustment vibrating arms 61 and 62 varies from 0.5 to 0.15, the current value varies by about 3%.

Upon comparison between FIG. 6 and FIG. 7, a current value per unit length when the electrode length L1 of the adjustment electrode of the first adjustment vibrating arms 51 and 52 varies is greater than a current value per unit length when the electrode length L2 of the adjustment electrode of the second adjustment vibrating arms 61 and 62 varies. Therefore, the first adjustment vibrating arms 51 and 52 are used for coarse adjustment, the second adjustment vibrating arms 61 and 62 are used for fine adjustment, and thereby the coarse adjustment and the fine adjustment can be continuously performed.

Figure 8:
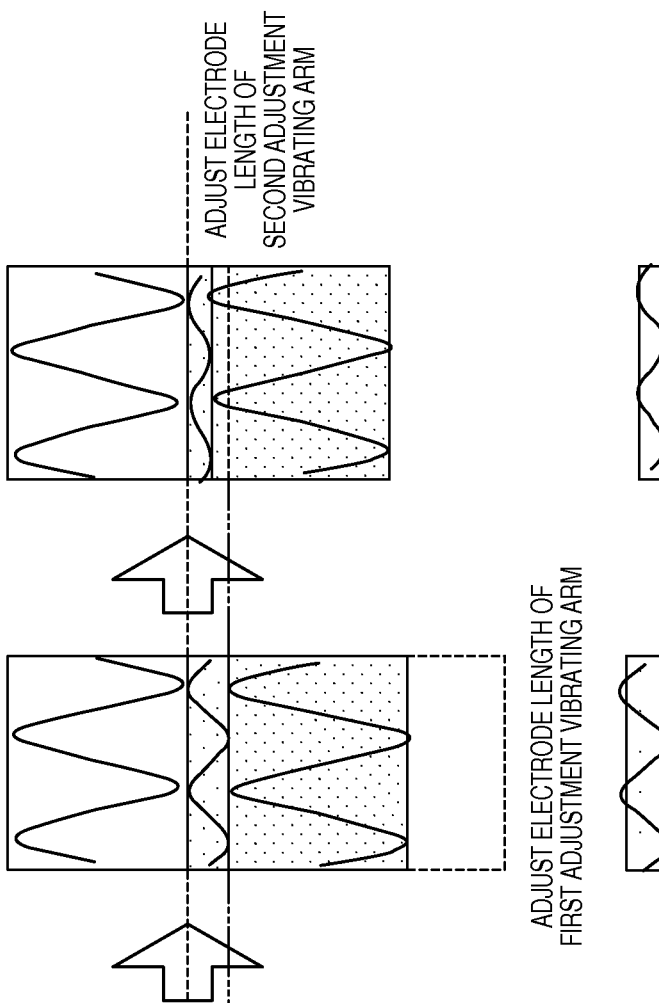
FIGS. 8A to 8C are explanatory diagrams schematically illustrating an example in which leakage vibration is suppressed.

FIGS. 8A to 8C are explanatory diagrams schematically illustrating an example of suppressing leakage vibration using the above-described concept. FIG. 8A shows an output waveform of each signal before electrode lengths of the electrode lengths L1 and L2 are adjusted, FIG. 8B shows each output waveform when the electrode length L1 of the first adjustment vibrating arms 51 and 52 is adjusted, and FIG. 8C shows each output waveform when the electrode length L2 of the second adjustment vibrating arms 61 and 62 is adjusted.

As shown in FIG. 8A, an output signal (tuning signal) of the first adjustment vibrating arms 51 and 52 and the second adjustment vibrating arms 61 and 62 is out of phase (shifted by 180 degrees) with respect to a leakage signal of the detection vibrating arms 31 and 32, and a current value of the tuning signal is greater than a current value of the leakage signal. In this case, as shown on the lowermost part in the figure, an apparent leakage signal obtained by combining the leakage signal and the tuning signal is output. In other words, it is shown that the leakage vibration is not suppressed.

Therefore, first, the electrode length L1 of the first adjustment vibrating arms 51 and 52 is adjusted. Then, as shown in FIG. 8B, an output value (current value) of a tuning signal is reduced by an adjusted amount, and thus an apparent leakage signal as shown on the lowermost part in the figure is output. In other words, it is shown that the leakage vibration is not sufficiently suppressed through only the adjustment of the first adjustment vibrating arms 51 and 52. In addition, the first adjustment vibrating arms 51 and 52 are adjusted so as to arrive at a value equal to or less than the upper limit of a variable current value of the second adjustment vibrating arms 61 and 62 through adjustment of the second adjustment vibrating arms.

Successively, the electrode length L2 of the second adjustment vibrating arms 61 and 62 is adjusted.

As shown in FIG. 8C, by adjusting the electrode length L2 of the second adjustment vibrating arms 61 and 62, apparent leakage vibration can be suppressed to a range acceptable to detection of the vibration gyro-element 10.

A description will be made of a manufacturing method of the vibration gyro-element 10 as a vibrator element based on the concept of leakage vibration suppression.

Manufacturing Method of Vibrator Element

Figure 9:
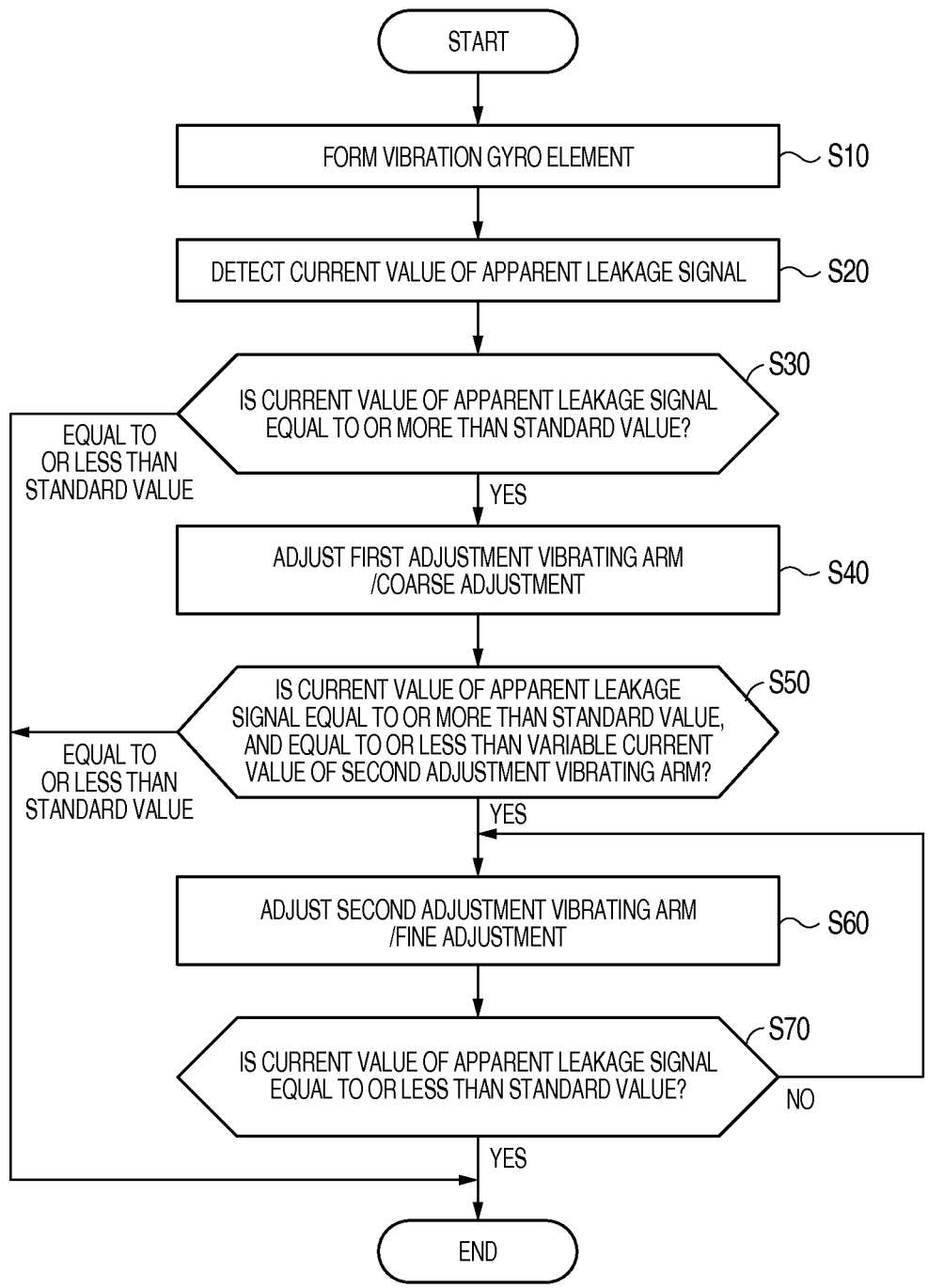
FIG. 9 is a process explanatory diagram illustrating main processes related to manufacturing of the vibration gyro-element.

FIG. 9 is a process explanatory diagram illustrating main processes related to manufacturing of the vibration gyro-element 10 as a vibrator element. Here, the description will be made mainly based on a method of suppressing leakage vibration.

First, the vibration gyro-element 10 which is a vibrator element configured as shown in FIG. 1 is formed (S10). In the vibration gyro-element 10, as shown in FIG. 1, exteriors of the base portion 20, and the excitation vibrating arms 21 and 22, the detection vibrating arms 31 and 32, the first adjustment vibrating arms 51 and 52, and the second adjustment vibrating arms 61 and 62, extending from the base portion 20 are formed through wet etching or dry etching, and, the respective excitation electrodes, the respective detection electrodes, and the respective adjustment electrodes as shown in FIGS. 2 and 3 are formed using a sputtering method or a deposition method.

Next, a current value of an apparent leakage signal obtained by combining a leakage signal of the detection vibrating arms 31 and 32 and a tuning signal of the first adjustment vibrating arm 51 and the second adjustment vibrating arm 61 is detected (S20), and the current value of the apparent leakage signal is compared with a standard value (S30).

Here, if the apparent leakage signal is smaller than the standard value, the process finishes since adjustment is not necessary. In addition, the standard value indicates a current value of an extent of not influencing the detection characteristics of the vibration gyro-element 10.

If the apparent leakage signal is larger than the standard value, the flow proceeds to a subsequent process.

Next, the electrode length L1 of the adjustment electrodes of the first adjustment vibrating arms 51 and 52 is adjusted so as to perform a coarse adjustment of a tuning signal (S40). The electrode length L1 may be lengthened by further adding an electrode or be shortened by removing the front end part of the adjustment electrode with a laser or the like.

In addition, it is determined whether a current value of the apparent leakage signal is equal to or more than a standard value and equal to or less than a variable current value of the second adjustment vibrating arms 61 and 62 (S50). If the current value of the apparent leakage signal is equal to or less than the standard value, the process finishes since the subsequent fine adjustment is not necessary. Further, if the current value of the apparent leakage signal is equal to or more than the standard value and equal to or less than the variable current value due to adjustment of the second adjustment vibrating arms 61 and 62 (YES), the flow proceeds to a subsequent process.

Next, a fine adjustment of the tuning signal is performed by adjusting the second adjustment vibrating arms 61 and 62 (S60), and, subsequently, it is determined whether or not a current value of an apparent leakage signal is equal to or less than the standard value (S70), and the second adjustment vibrating arms 61 and 62 are adjusted until the current value is smaller than the standard value. When the current value is equal to or less than the standard value (YES), the process finishes since leakage vibration of the vibration gyro-element 10 is appropriately suppressed.

According to the above-described vibration gyro-element 10 which is a vibrator element and manufacturing method of the vibration gyro-element, a tuning signal of the first adjustment vibrating arms 51 and 52 and the second adjustment vibrating arms 61 and 62 is phase-shifted by 180 degrees with respect to an output signal (leakage signal) of leakage vibration of the detection vibrating arms 31 and 32, and thereby it is possible to suppress the leakage signal of the detection vibrating arms 31 and 32. In addition, it is possible to suppress leakage vibration by removing or adding a part of each adjustment electrode which is an adjustment portion provided in the first adjustment vibrating arms 51 and 52. This method is advantageous to miniaturization and enables an accurate adjustment to be performed as compared with a method in the related art of suppressing and adjusting a leakage output by processing a part of the exterior of the vibration gyro-element 10, and thus it is possible to provide a vibrator element which is miniaturized and has high mechanical strength and a high sensitivity characteristic.

In addition, a variation of a current value of a leakage signal relative to an adjustment amount is increased by adjusting the electrode length L1 of the adjustment electrodes of the first adjustment vibrating arms 51 and 52 which are an adjustment portion, and a variation of a current value of a leakage signal relative to an adjustment amount is decreased by adjusting the electrode length L2 of the adjustment electrodes of the second adjustment vibrating arms 61 and 62 which are an adjustment portion. Thereby, the first adjustment vibrating arms 51 and 52 can be used for coarse adjustment, the second adjustment vibrating arms 61 and 62 can be used for fine adjustment, and thereby it is possible to suppress leakage vibration widely and with high accuracy.

In addition, the excitation electrodes 23*a*, 23*b*, 24*a*, 24*b*, 25*a*, 25*b*, 26*a* and 26*b* are provided in the excitation vibrating arms 21 and 22, and the detection electrodes 33*a*, 33*b*, 34*a*, 34*b*, 35*a*, 35*b*, 36*a* and 36*b* which electrically detect vibration which is generated according to a physical quantity applied when the excitation vibrating arms 21 and 22 are excited are provided in the detection vibrating arms 31 and 32. With this configuration, when a physical quantity such as an angular velocity or acceleration is applied to the vibration gyro-element 10, the physical quantity can be detected using these detection electrodes, and thus it is possible to implement a physical quantity sensor (for example, an angular velocity sensor, an acceleration sensor, or the like) which is miniaturized and has high sensitivity characteristics. Further, in the vibration gyro-element 10, the excitation vibrating arms 21 and 22 of an excitation system and the detection vibrating arms 31 and 32 of a detection system are separated from each other, and thus electrostatic coupling between the electrodes or wires of the vibrating arms of the excitation system and the vibrating arms of the detection system is reduced so as to stabilize detection sensitivity.

In addition, since the first adjustment vibrating arms 51 and 52 and the second adjustment vibrating arms 61 and 62 which are vibrating arms of an adjustment system are separated from the excitation vibrating arms 21 and 22 and the detection vibrating arms 31 and 32, electrostatic coupling between the electrodes or wires is reduced, and thus it is possible to suppress deterioration in detection sensitivity due to provision of the vibrating arms of the adjustment system.

In addition, the adjustment electrodes 63*a*, 63*b*, 64*a*, 64*b*, 65*a*, 65*b*, 65*c*, 66*a*, 66*b* and 66*c* provided in the first adjustment vibrating arms 51 and 52 and the second adjustment vibrating arms 61 and 62 are electrically connected to the detection electrodes 33*a*, 33*b*, 34*a*, 34*b*, 35*a*, 35*b*, 36*a* and 36*b*. In this way, some of the adjustment electrodes 63*a*, 63*b*, 64*a*, 64*b*, 65*a*, 65*b*, 65*c*, 66*a*, 66*b* and 66*c* are removed, for example, with laser irradiation, or a metal film is added through deposition or sputtering, and thereby leakage vibration can be controlled. Therefore, it is possible to suppress and adjust a leakage output with higher accuracy.

Gyro-Sensor

Next, a gyro-sensor which is a sensor unit having the above-described vibration gyro-element 10 will be described.

Figure 10:
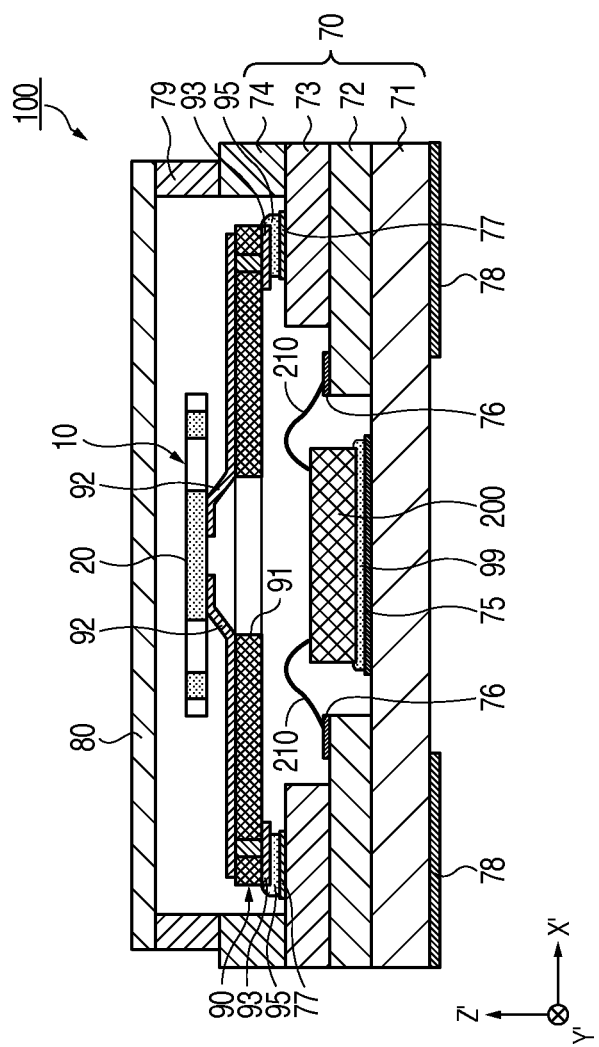
FIG. 10 is a cross-sectional view illustrating a schematic configuration of a gyro sensor.

FIG. 10 is a cross-sectional view illustrating a schematic configuration of the gyro-sensor. The gyro-sensor 100 includes an IC chip 200 as an electronic component which has the vibration gyro-element 10, an excitation circuit which excites the excitation vibrating arms 21 and 22 of the vibration gyro-element 10, and a detection circuit which detects a detection signal occurring in the detection vibrating arms 31 and 32, and a package 70 accommodating the vibration gyro-element 10 and the IC chip.

In the package 70, for example, a second layer substrate 72, a third layer substrate 73, and a fourth layer substrate 74, which have rectangular ring shapes with different sizes of openings from one another, are provided in this order on a first layer substrate 71 with a plate shape in an overlapping manner so as to form a recessed portion with a step difference or protrusion, and the vibration gyro-element 10 and the IC chip 200 can be accommodated in the recessed portion. As a material of the package 70, for example, ceramic, glass, or the like may be used.

A die pad 75 on which the IC chip 200 is disposed is provided on the first layer substrate 71 which is a bottom of the recessed portion of the package 70. In addition, external mounting terminals 78 which are used for bonding with an external substrate are provided on a surface which is an outer bottom surface of the package 70 and is different from the surface on which the die pad 75 of the first layer substrate 71 is provided.

In the recessed portion of the package 70, a plurality of IC connection terminals 76 which are bonded to a plurality of electrode pads (not shown) provided in an active surface of the IC chip 200 so as to correspond thereto are provided on the step difference which is formed so as to surround the die pad 75 by the second layer substrate 72.

In addition, vibrator element connection terminals 77 which are bonded to the vibration gyro-element 10 via a relay substrate 90 are provided on the step difference which is formed so as to surround the IC connection terminals 76 by the third layer substrate 73 on the second layer substrate 72 on which a plurality of IC connection terminals 76 are provided.

In the various terminals provided in the package 70, corresponding terminals are connected to each other via drawn-out wires or in-layer wires such as through-holes (not shown).

The IC chip 200 includes an excitation circuit which serves as an excitation means for exciting and vibrating the vibration gyro-element 10, and a detection circuit which serves as a detection means for detecting detection vibration occurring in the vibration gyro-element 10 when an angular velocity is applied. Specifically, the excitation circuit of the IC chip 200 supplies an excitation signal to the excitation electrodes 23a, 23b, 24a, 24b, 25a, 25b, 26a and 26b (refer to FIGS. 2 and 3) formed in a pair of the excitation vibrating arms 21 and 22 of the vibration gyro-element 10. In addition, the detection circuit of the IC chip 200 amplifies a detection signal occurring in the detection electrodes 33a, 33b, 34a, 34b, 35a, 35b, 36a and 36b formed in a pair of detection vibrating arms 31 and 32 of the vibration gyro-element 10 so as to generate an amplified signal, and detects an angular velocity applied to the gyro-sensor 100 based on the amplified signal.

The IC chip 200 is adhered and fixed to the die pad 75 provided on the bottom of the recessed portion of the package 70, for example, via brazing filler metal (die-attach material) 99. In addition, the IC chip 200 is electrically connected to the package 70 using a wire bonding method. In other words, a plurality of electrode pads provided in the IC chip 200 are connected to the corresponding IC connection terminals 76 of the package 70 via bonding wires 210.

In the recessed portion of the package 70, the vibration gyro-element 10 is bonded over the IC chip 200 via the relay substrate 90.

The relay substrate 90 is a wire substrate for giving predetermined elasticity to the vibration gyro-element 10 and supporting the vibration gyro-element 10 and for relaying electrical connection between the vibration gyro-element 10 and the package 70 without forming a complex support structure for supporting the vibration gyro-element 10 in the recessed portion of the package 70. The relay substrate 90 of the present embodiment includes an insulating material having an opening (device hole) 91 which is provided in a region where the base portion 20 provided with a supporting part of the vibration gyro-element 10 is disposed, a plurality of electrode leads 92, and connection electrodes 93 which are electrically connected to the corresponding electrode leads 92 via in-layer wires or the like of the base material. In each of a plurality of electrode leads 92, one end thereof is provided on the base material, and the other end extends in a state of overhanging toward the center of the opening 91 of the base material.

The overhanging part in the opening 91 of the electrode lead 92 is bent obliquely upward (a lid 80 side) once in the middle of being directed to the center of the opening 91 from the upper part of the base material, and then is bent again horizontally toward the center of the opening 91. The other end (front end part) of each electrode lead 92 is disposed at a position corresponding to an external connection terminal (not shown) provided in the base portion 20 of the vibration gyro-element 10, and is used for electrical connection and mechanical bonding of the vibration gyro-element 10.

For example, a Tape Automated Bonding (TAB) substrate for TAB mounting which is known in the related art, may be used for the relay substrate 90. A TAB substrate in which a plurality of relay substrates 90 are formed with an equal interval in a hoop-shaped insulating material is used, and thereby procedures from manufacturing of the relay substrate 90 to mounting of the vibration gyro-element 10 can be continuously and efficiently performed.

In addition, the relay substrate 90 is not limited to the TAB substrate described in the present embodiment, and may be formed using, for example, a lead frame or the like.

In order to bond the vibration gyro-element 10 to the relay substrate 90, a metal layer for bonding such as, for example, tin (Sn) or gold (Au) is formed on the surface of the electrode lead 92 in advance through plating or the like. In addition, a metal layer for bonding is also formed on the external connection electrode (not shown) provided in the base portion 20 of the vibration gyro-element 10, each electrode lead 92 is aligned with the corresponding external connection electrode, and the bonding can be performed in a metal eutectic or metal bonding method through heating and pressing. As another bonding method, a method (flip chip bonding) of bonding them together via a bonding member such as a metal bump or a conductive adhesive may be employed.

The vibration gyro-element 10 which is bonded via a plurality of electrode leads 92 which extend in a state of overhanging in the opening 91 of the relay substrate 90 is flexibly supported by elasticity of the formed electrode leads 92. Thereby, when an impact due to falling or the like is applied to the gyro-sensor 100, the impact is alleviated by the electrode leads 92, and thus it is possible to prevent a problem such as destruction or the like of the vibration gyro-element 10, thereby achieving an effect of improving impact resistance of the gyro-sensor 100.

The relay substrate 90 to which the vibration gyro-element 10 is bonded over the IC chip 200 in the recessed portion of the package 70. Specifically, the connection electrodes 93 which are electrically connected to a plurality of electrode leads 92 of the relay substrate 90 connected to the vibration gyro-element 10 and are provided on the surface different from the surface of the relay substrate 90 bonded to the vibration gyro-element 10 are aligned with the vibrator element connection terminals 77 provided on the step difference formed by the third layer substrate 73 of the package 70, and electrically connected, bonded and fixed thereto, for example, via bonding members 95 such as a conductive adhesive.

In addition, although, in the present embodiment, a form in which the vibration gyro-element 10 is bonded inside the package 70 via the relay substrate 90 has been described, the present invention is not limited thereto, and a supporting structure which does not cause vibration leakage or the like in the vibration gyro element 10 may be used. For example, a supporting portion having a connection terminal may be provided in the recessed portion of the package 70, and a supporting structure which allows the vibration gyro-element 10 to be bonded thereto and supports the vibration gyro-element 10 may be formed in the supporting portion.

The lid 80, which is a lid body, is disposed on the package 70 in which the IC chip 200 and the vibration gyro-element 10 are bonded together and seals the opening of the package 70. As a material of the lid 80, for example, a metal such as a 42 alloy (an alloy in which 42% of nickel is contained in iron) or kovar (an alloy of iron, nickel, and cobalt), ceramics, glass, or the like may be used. For example, the lid 80 made of metal is bonded to the package 70 through seam welding via a seal ring 79 which is formed by die-cutting a kovar alloy or the like in a rectangular ring shape. A recessed space formed by the package 70 and the lid 80 is a space where the vibration gyro-element 10 is operated.

The recessed space may be a space in which pressure is reduced, or a space which is closed and sealed in an inert gas atmosphere (details thereof will be described later).

According to the gyro-sensor 100 with the above-described configuration, if any of the adjustment electrodes 63a, 63b, 64a, 64b, 65a, 65b, 65c, 66a, 66b and 66c of the first adjustment vibrating arms 51 and 52 and the second adjustment vibrating arms 61 and 62 provided in the vibration gyro-element 10 is adjusted (the electrode length L1 or L2 is adjusted), an adjustment for suppressing a leakage output can be performed, and thus it is possible to provide the gyro-sensor 100 with high detection sensitivity.

Electronic Apparatus

An electronic apparatus having the above-described gyro-sensor 100 mounted therein can achieve miniaturization, and can improve sensitivity since a leakage output is reduced. Hereinafter, electronic apparatuses having the gyro-sensor 100 mounted therein will be exemplified in FIGS. 11A to 11C and be described.

Figure 11A:
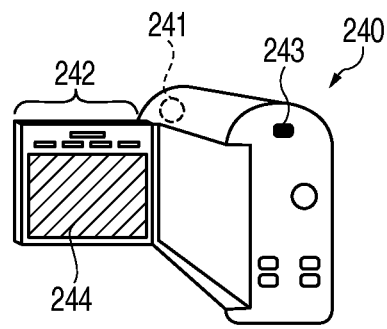
FIG. 11A is a perspective view illustrating an application example to a digital video camera.

FIG. 11A is a perspective view illustrating an application example to a digital video camera. The digital video camera 240 includes an image receiving portion 241, an operation portion 242, an audio input portion 243, and a display unit 244. The gyro-sensor 100 using the vibration gyro-element 10 of the above-described embodiment is mounted in the digital video camera 240, and thereby it is possible to provide a so-called camera shake correction function.

Figure 11B:
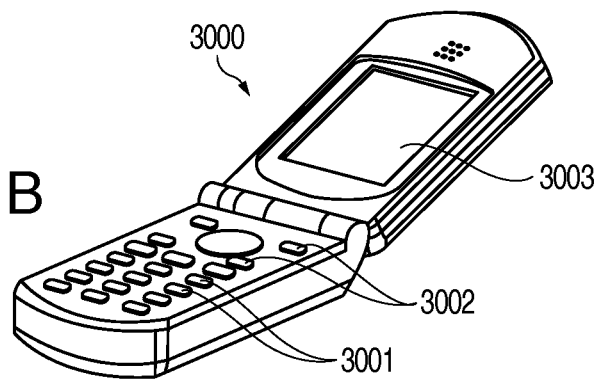
FIG. 11B is a perspective view illustrating a mobile phone as an electronic apparatus.

FIG. 11B is a perspective view illustrating a mobile phone which is an electronic apparatus. The mobile phone 3000 includes a plurality of operation buttons 3001 and scroll buttons 3002, and a display unit 3003. The scroll buttons 3002 are operated, and thereby a screen displayed on the display unit 3003 is scrolled.

Figure 11C:
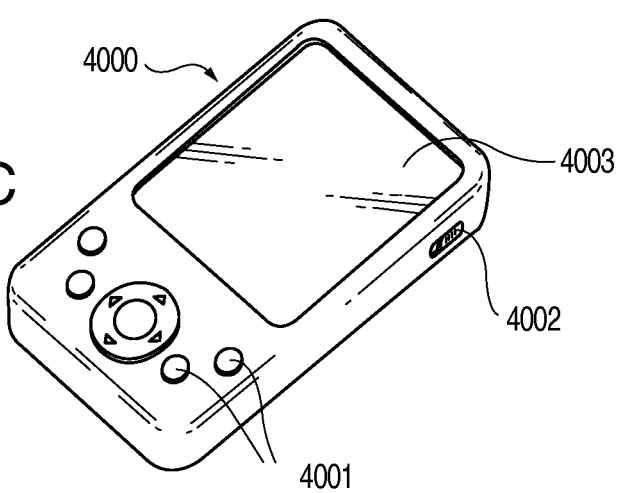
FIG. 11C is a perspective view illustrating an application example to a Personal Digital Assistant (PDA).

FIG. 11C is a perspective view illustrating an application example to a Personal Digital Assistant (PDA). The PDA 4000 includes a plurality of operation buttons 4001, a power switch 4002, and a display unit 4003. When the power switch 4002 is operated, a variety of information such as an address book or an appointment book is displayed on the display unit 4003.

The above-described vibration gyro-element 10 or the gyro-sensor 100, which is a sensor unit, is mounted in the mobile phone 3000 or the PDA 4000, and thereby it is possible to give various functions. For example, if a camera function (not shown) is added to the mobile phone 3000 shown in FIG. 11B, camera shake correction can be performed in the same manner as in the digital video camera 240. In addition, if the mobile phone 3000 or the PDA 4000 shown in FIG. 11C is provided with a Global Positioning System (GPS), the vibration gyro-element 10 or the gyro-sensor 100 is mounted therein, and thereby the GPS can recognize a position or a posture of the mobile phone 3000 or the PDA 4000.

In addition, an electronic apparatus to which the gyro-sensor 100 having the vibration gyro-element 10 described in the embodiment is applicable is not limited to the electronic apparatuses exemplified in FIGS. 11A to 11C, and may include a mobile computer, a car navigation apparatus, an electronic organizer, a calculator, a workstation, a television phone, a POS terminal, a gaming machine, and the like.

Although the embodiment of the invention has been described in detail, the invention is not limited to the above-described embodiment and may have various modifications in the scope without departing from the spirit thereof.

For example, although an example of using a quartz crystal as a material for forming the vibration gyro-element which is a vibrator element has been described, piezoelectric body materials other than the quartz crystal may be used. For example, aluminum nitride (AlN), an oxide substrate such as lithium niobate ($LiNbO_3$), lithium tantalate ($LiTaO_3$), lead zirconate titanate (PZT), lithium tetraborate ($Li_2B_4O_7$), or langasite ($La_3Ga_5SiO_{14}$), a laminated piezoelectric substrate which is formed by laminating a piezoelectric body material such as aluminum nitride or tantalum pentoxide ($Ta_2O_5$) on a glass substrate, or piezoelectric ceramics or the like may be used.

In addition, a vibrator element may be formed using materials other than the piezoelectric body material. For example, a vibrator element may be formed using a silicon semiconductor material or the like.

In addition, a vibration (excitation) scheme of a vibrator element is not limited to piezoelectric excitation. The configuration of the invention is applicable to a vibrator element of an electrostatic excitation type using an electrostatic force or a Lorentz excitation type using a magnetic force in addition to the piezoelectric excitation type using a piezoelectric substrate, and the effects of the invention can be achieved.

The entire disclosure of Japanese Patent Application No. 2012-087124, filed Apr. 6, 2012 is expressly incorporated by reference herein.

What is claimed is:

1. A vibrator element comprising:
   a base portion;
   an excitation vibrating arm and a detection vibrating arm extending from the base portion; and
   a first adjustment vibrating arm and a second adjustment vibrating arm extending from the base portion and vibrating along with excitation vibration of the excitation vibrating arm,
   wherein an output signal of the first adjustment vibrating arm at least is in an opposite phase with respect to an output signal of leakage vibration of the detection vibrating arm, and
   wherein when a vibration frequency of the first adjustment vibrating arm is indicated by $f_{tu1}$, a vibration frequency of the second adjustment vibrating arm is indicated by $f_{tu2}$, a vibration frequency of the excitation vibrating arm is indicated by fk, and $\Delta f1 = |fk - f_{tu1}|$ and $\Delta f2 = |fk - f_{tu2}|$, $\Delta f1 < \Delta f2$ is satisfied.

2. The vibrator element according to claim 1, wherein the detection vibrating arm is provided with a detection electrode which electrically detects vibration generated according to a physical quantity applied when the excitation vibrating arm is excited, and
   wherein each of the first adjustment vibrating arm and the second adjustment vibrating arm is provided with an adjustment electrode which is electrically connected to the detection electrode.

3. The vibrator element according to claim 1, wherein the excitation vibrating arm extends from one end of the base portion,
   wherein the detection vibrating arm extends from the other end of the base portion on an opposite side to one end,
   wherein the first adjustment vibrating arm extends in the extending direction of the excitation vibrating arm, and
   wherein the second adjustment vibrating arm extends in the extending direction of the detection vibrating arm.

4. The vibrator element according to claim 1, wherein a length of the first adjustment vibrating arm is greater than a length of the second adjustment vibrating arm.

5. A sensor unit comprising:
the vibrator element according to claim 1;
an electronic component including an excitation circuit which excites the excitation vibrating arm and a detection circuit which detects a detection signal occurring in the detection vibrating arm; and
a package accommodating the vibrator element and the electronic component.

6. An electronic apparatus comprising the vibrator element according to claim 1.

* * * * *